(12) United States Patent
Lai

(10) Patent No.: US 8,859,343 B2
(45) Date of Patent: Oct. 14, 2014

(54) 3D SEMICONDUCTOR STRUCTURE AND MANUFACTURING METHOD THEREOF

(71) Applicant: MACRONIX International Co., Ltd., Hsin-Chu (TW)

(72) Inventor: Erh-Kun Lai, Taichung County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/868,918

(22) Filed: Apr. 23, 2013

(65) Prior Publication Data

US 2014/0264524 A1 Sep. 18, 2014

Related U.S. Application Data

(60) Provisional application No. 61/778,487, filed on Mar. 13, 2013.

(51) Int. Cl.
*H01L 21/82* (2006.01)
*H01L 29/78* (2006.01)
*H01L 29/66* (2006.01)

(52) U.S. Cl.
CPC .......... *H01L 29/78* (2013.01); *H01L 29/66477* (2013.01)
USPC ........................... 438/128; 438/142; 438/478

(58) Field of Classification Search
USPC ......................................... 438/128, 142, 478
See application file for complete search history.

(56) References Cited

U.S. PATENT DOCUMENTS

| 5,707,884 A * | 1/1998 | Fontana et al. ............... 438/258 |
| 8,648,414 B2 * | 2/2014 | Tang et al. ..................... 257/332 |
| 2013/0001682 A1 * | 1/2013 | Tang et al. ..................... 257/331 |

* cited by examiner

*Primary Examiner* — Long Pham
(74) *Attorney, Agent, or Firm* — J.C. Patents

(57) ABSTRACT

A semiconductor structure includes a plurality of stacked strips on a substrate and a plurality of conductive lines on the stacked strips. The stacked strips and the conductive lines are arranged orthogonally to each other and a conductive liner is formed there between. A first air gap fills the space between the two adjacent stacked strips and under one of the conductive lines, which is positioned on top of said two adjacent stacked strips, whereas a second air gap is between the two adjacent conductive lines. The material of the conductive liner is different from that of the conductive lines. The distance between the two adjacent stacked strips is below 200 nm, and the aspect ratio of the stacked strip is at least 1.

5 Claims, 15 Drawing Sheets

US 8,859,343 B2

3D SEMICONDUCTOR STRUCTURE AND MANUFACTURING METHOD THEREOF

CROSS-REFERENCE TO RELATED APPLICATION

This application claims the priority benefit of U.S. provisional application Ser. No. 61/778,487, filed on Mar. 13, 2013. The entirety of the above-mentioned patent application is hereby incorporated by reference herein and made a part of this specification.

FIELD OF THE INVENTION

The present invention generally relates to a semiconductor structure, and more particularly, to a 3-dimensional (3D) semiconductor memory structure.

BACKGROUND

Due to the intense demand for a high-density memory in the semiconductor industry (for example, floating gate memory, charge trapping memory, non-volatile memory, and embedded memory), the architecture of a memory cell has transitioned from a planar structure to a 3-dimensional structure, which increases the storage capacity within a limited chip area. A cross-point array is one form of 3D memory structures that includes a plurality of word-lines, a plurality of bit-lines, and a memory layer sandwiched between the word-lines and the bit-lines.

Along the process of scaling, not only has the dimension of the bit-line (and word-line) themselves shrunk but also the distance therebetween. In terms of the cross-point arrays, the aspect ratio of the bit-line constantly increases in pursuing an even higher storage capacity by creating multiple memory cells in a single footprint of the cross-point. The problem regarding the high aspect ratio also applied to the processing of word-line due to the stacking structure of the 3D memory. A pattern-defining procedure such as an anisotropic etch faces a more stringent condition because of the high aspect ratio and the narrow space between the bit-lines (and word-lines). Bridging effect occurs as a result of creating the above-mentioned pattern and causes operational failure of the memory device.

In a conventional cross-point 3D memory structure, word-line to word-line coupling becomes a serious problem when the spaces between the word-lines decline. Word-line coupling can be attributed to longer word-lines and narrower spacing, and of course, the conventional 3D memory structure forms a high overlapping area between adjacent word-lines, and hence, increases the coupling capacitance.

3D memory structures that effectively overcome the bridging and coupling effect are, therefore, desired. However, said structure would be of greater demand if the manufacturing process is straightforward and the processing cost is controlled.

SUMMARY OF THE INVENTION

The objective of the present invention is to provide a 3-dimensional (3D) semiconductor memory structure and the manufacturing methods thereof.

One embodiment demonstrates a semiconductor structure, including a substrate; a plurality of stacked strips arranged parallel to each other, and positioned on the substrate; and a plurality of conductive lines arranged parallel to each other, and positioned orthogonally on the stacked strips. Because not all of the bottom surface of the conductive line is conformal to the top surface of the stacked strip, a first air gap fills the space between two adjacent stacked strips and under one of the conductive lines, which is positioned on top of said two adjacent stacked strips, whereas a second air gap is between the two adjacent conducive lines. The distance between the two adjacent stacked strips is below 200 nm, and the aspect ratio of the stacked strip is at least 1.

The aforementioned semiconductor structure can be manufactured by at least two methods. One example in the present invention is to form the plurality of stacked strips on a substrate, and then form a conductive liner compliant to the contour of the stacked strips by a conformal deposition. A layer of non-conformal conductive film is deposited and supported by the underlying stacked strips, followed by an etching step to define the pattern of the conductive lines.

Another example in the present invention is to form a plurality of stacked strips on a substrate, and form a conductive liner compliant to the contour of the stacked strips by a conformal deposition. A planarization process follows to level the top surface of the stacked strip with ashable materials, and then etch back the ashable materials to expose the conformal conductive liner. A plurality of conductive lines is formed, parallel to each other, on the ashable materials and in contact with the exposed conductive liner. In such example, the ashable materials is removed after the conductive lines are formed.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

BRIEF DESCRIPTION OF THE DRAWINGS

The invention will be described according to the appended drawings in which.

DETAILED DESCRIPTION OF THE INVENTION

Figure 1:
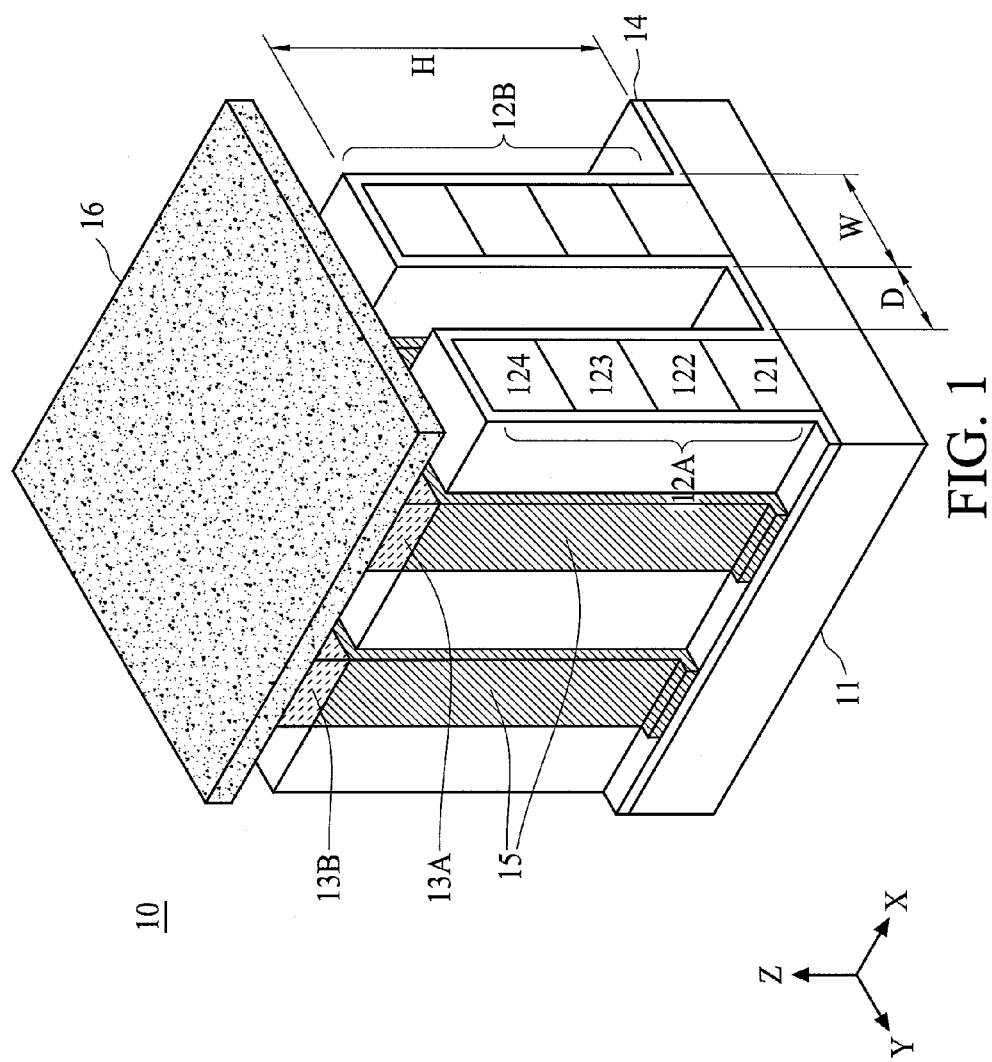
FIG. 1 is a perspective view of a 3-dimensional (3D) semiconductor memory structure according to one embodiment of the present invention.

FIG. 1 illustrates a portion of a 3D memory structure 10 according to one embodiment of the present invention. Two stacked strips (12A, 12B) comprising conductive strips (121, 123) and insulating strips (122, 124) are positioned parallel to each other along the X-axis on a substrate 11. Two conductive lines (13A, 13B) are parallel to each other along the Y-axis and positioned on the two stacked strips. In the present embodiment, the orientation of the stacked strips (X-axis) with respect to that of the conductive lines (Y-axis) is orthogonal. However, the scope of the invention is not limited to this arrangement and any angle of alignment may be covered within the scope of this invention. In the present embodiment, the distance D between two stacked strips (12A, 12B) is 150 nm, whereas the aspect ratio, that is, the height H over the width W, of the stacked strip is 10. However, any distance D below 200 nm and any aspect ratio (H/W) above 1 is considered applicable in order to complete the memory structure 10.

At least two air gaps are present in the memory structure 10. One of the air gaps fills the space between two stacked strips (12A, 12B) and under the conductive line 13A. In other words, the conductive line 13A is structurally supported by the underlying stacked strips (12A, 12B). The other air gap is between the two conductive lines (13A, 13B) and under an insulating layer 16. In one embodiment, the stacked strips (12A, 12B) can be bit-lines and the conductive lines (13A, 13B) can be word-lines. The presence of the at least two air gaps physically separates the adjacent conductive lines and the adjacent stacked strips. In one embodiment, the two air gaps form a percolated structure that connects the two gaps together.

The following description is focused on one stacked strip or one conductive line for succinctness, and the described materials and structural configuration can be applied to all of the stacked strips/conductive lines in the memory structure. The stacked strip 12A in the present embodiment is composed of multiple stacks 121-124 arranged in alternating sequence of two different materials. For example, stacks 122 and 124 can be insulating materials such as silicon dioxide, other silicon oxides, or silicon nitride; whereas stacks 121 and 123 can be conductive materials such as undoped, p-doped, or n-doped poly-silicon or epitaxial single crystal silicon. Stacks 122 and 124 are silicon oxides prepared by, not in a limited way, low pressure chemical vapor deposition LPCVD. The number of stacks is not limited to those illustrated the present embodiment and one pair of insulator-conductor stacks can implement the desired function of the present memory structure. The figures in the following description may not illustrate the stacking structure of the conductive strips, yet said stacking structure can be applied to those strips according to the aforementioned description.

The memory layer 14 is formed to be conformal to the stacked strip 12A. The materials of the memory layer 14 are bandgap engineered composite tunneling dielectric layers including a layer of silicon dioxide, a layer of silicon nitride, and a layer of silicon dioxide. Each layer of oxide or nitride is within nanometer levels, and other embodiments can implement five alternating thin dielectric layers (i.e. silicon oxide, silicon nitride, silicon oxide, silicon nitride, silicon oxide) as the memory layer 14. In one embodiment, LPCVD is used to form the nitride or oxide thin layers.

A conductive liner 15 of 1-5 nm is formed to be conformal to the previously deposited memory layer 14, so that the memory layer 14 is sandwiched between the conductive liner 15 and the stacked strip 12A. The conductive liner is deposited to provide a smooth interface to the conductive strips 12A and to form electrical coupling between the stacked strips 12A and the conductive lines (13A, 13B). The conformity of the conductive liner 15 prevents the presence of any voids between the conductive liner 15 and the under-covered stacked strip 12A. The materials of the conductive liner 15 can be selected from TiN, TaN, p type or n type poly-silicon, TANOS (TaN/WN/N, $Al_2O_3$, SiN, $SiO_2$, Si), WN, W, or the combination thereof, utilizing CVD processes available in the art. In a preferred embodiment, the conductive liner 15 and the conductive line 13A are different in terms of etching rate. For example, they can be different materials with distinct etching rates with respect to a specific etching process.

Conductive lines (13A, 13B) are positioned on the stacked strips (12A, 12B), and an electrical connection is formed between the bottom surface of the conductive lines (13A, 13B) and the conductive liner 15 of the stacked strips (12A, 12B). The conductive lines can be made of conductive materials such as tungsten silicide, aluminum, or TiN/TaN. An insulating layer or inter layer dielectric (ILD) 16 is positioned on the conductive lines, and is deposited in a non-conformal manner to form a continuous film. According to different fabrication processes applied to said memory structure 10, some of the fabrication processes may cause the sidewall of a portion of the conductive strip to have a limited amount of materials that compose the conductive line, and said portion may be the regions where the stacked strip is shadowed by the conductive line. To be more specific, the thickest portion of said conductive line materials on the sidewall of the conductive strip is at most one-tenth of the thickness of the conductive line. Other fabrication processes may not have the conductive line materials on said specific portion of the stacked strips. Some fabrication processes may cause the sidewall of a portion of the stacked strip to have an insulating layer or ILD materials, and said portion comprises the regions where a stacked strip is not shadowed by the conductive line.

Figure 2:
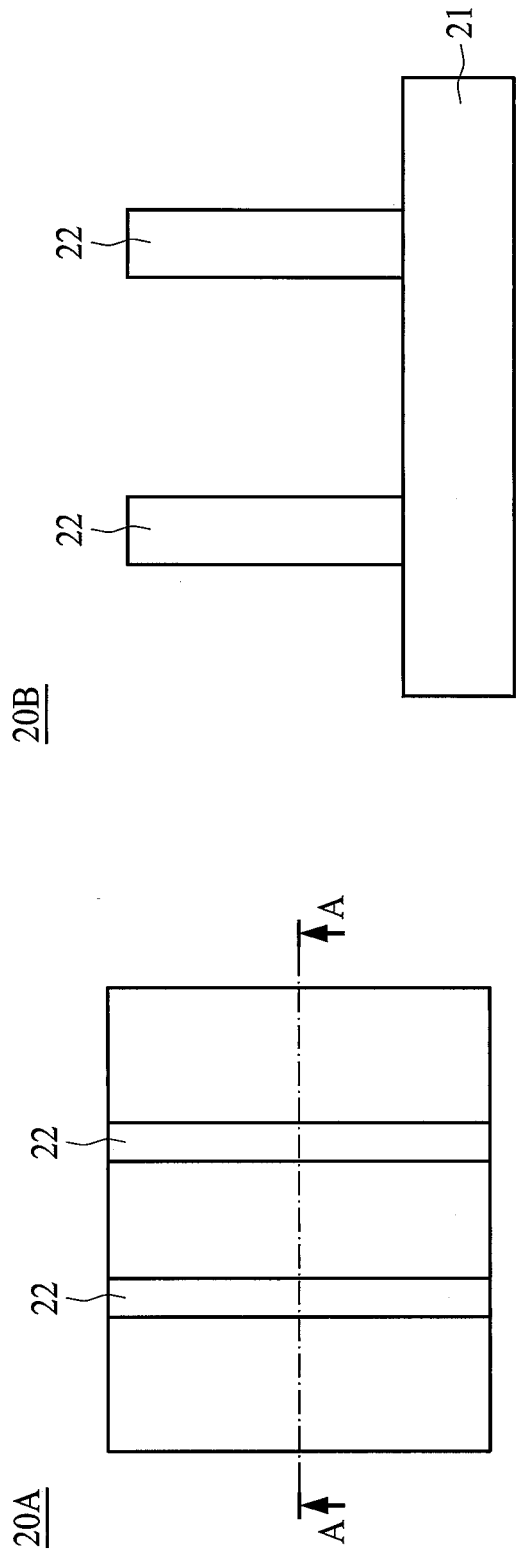
FIGS. 2 to 7 are top views and corresponding cross sectional views of the step of a manufacturing method of a 3-dimensional (3D) semiconductor memory structure according to one embodiment of the present invention.
Figure 3:
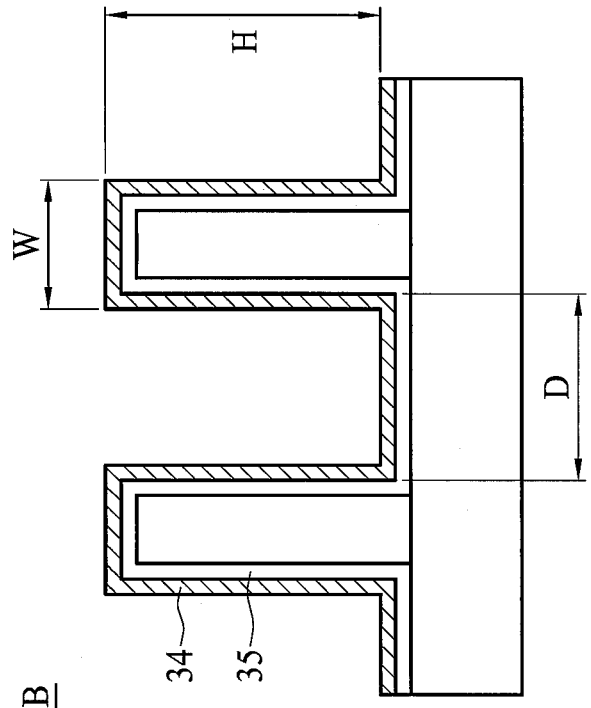
Figure 3:
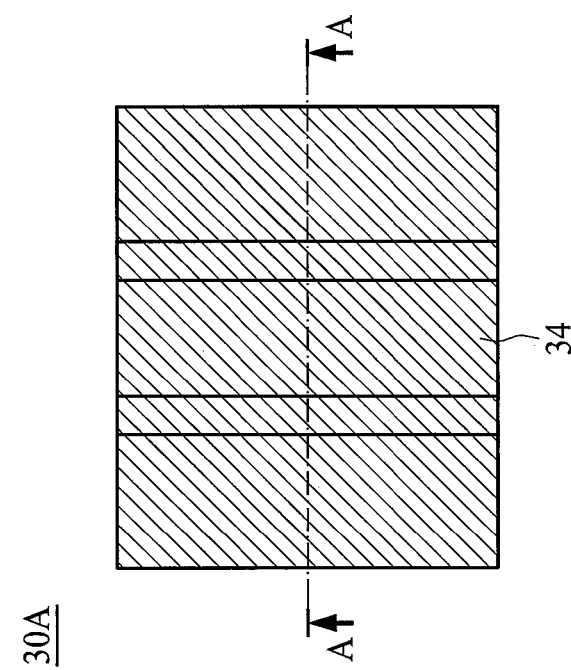

FIGS. 2 to 7 are top views and corresponding cross sectional views of the step of a manufacturing method of a 3-dimensional (3D) semiconductor memory structure according to one embodiment of the present invention. As shown in FIG. 2, 20A is the top view of the memory structure in fabrication, and 20B is the cross sectional counterpart along the broken line AA of 20A. A plurality of stacked strips 22 is formed on a substrate 21 parallel to each other. The stacking structure inside the stacked strip is described in the previous paragraphs and the detailed fabrication process of said stacking structure will not be recited herein. In FIG. 3, 30A is the top view of the memory structure in fabrication, and 30B is the cross sectional counterpart along the broken line AA of 30A. 30B shows a blanket deposition of a memory layer 35 followed by another blanket deposition of a conductive liner 34. The two blanket depositions are conformal to the pattern of the stacked strips, which at least has an aspect ratio (H/W) of 1, and the distance D between two adjacent strips is preferably 150 nm. In one embodiment, the deposition process can be implemented by LPCVD, wherein the deposition of the memory layer 35 may include multiple short depositions of thin dielectric layers such as ONO structures, that is, silicon oxide (1.5 nm)-silicon nitride (3.0 nm)-silicon oxide (3.5 nm), or ONONO structures. The materials of the conductive liner 34 can be chosen from TiN, TaN, p type or n type poly-silicon, TANOS (TaN/WN/N, $Al_2O_3$, SiN, $SiO_2$, Si), WN, W, or the combination thereof 30A shows the result of the blanket deposition of the top conductive liner 34.

Figure 4:
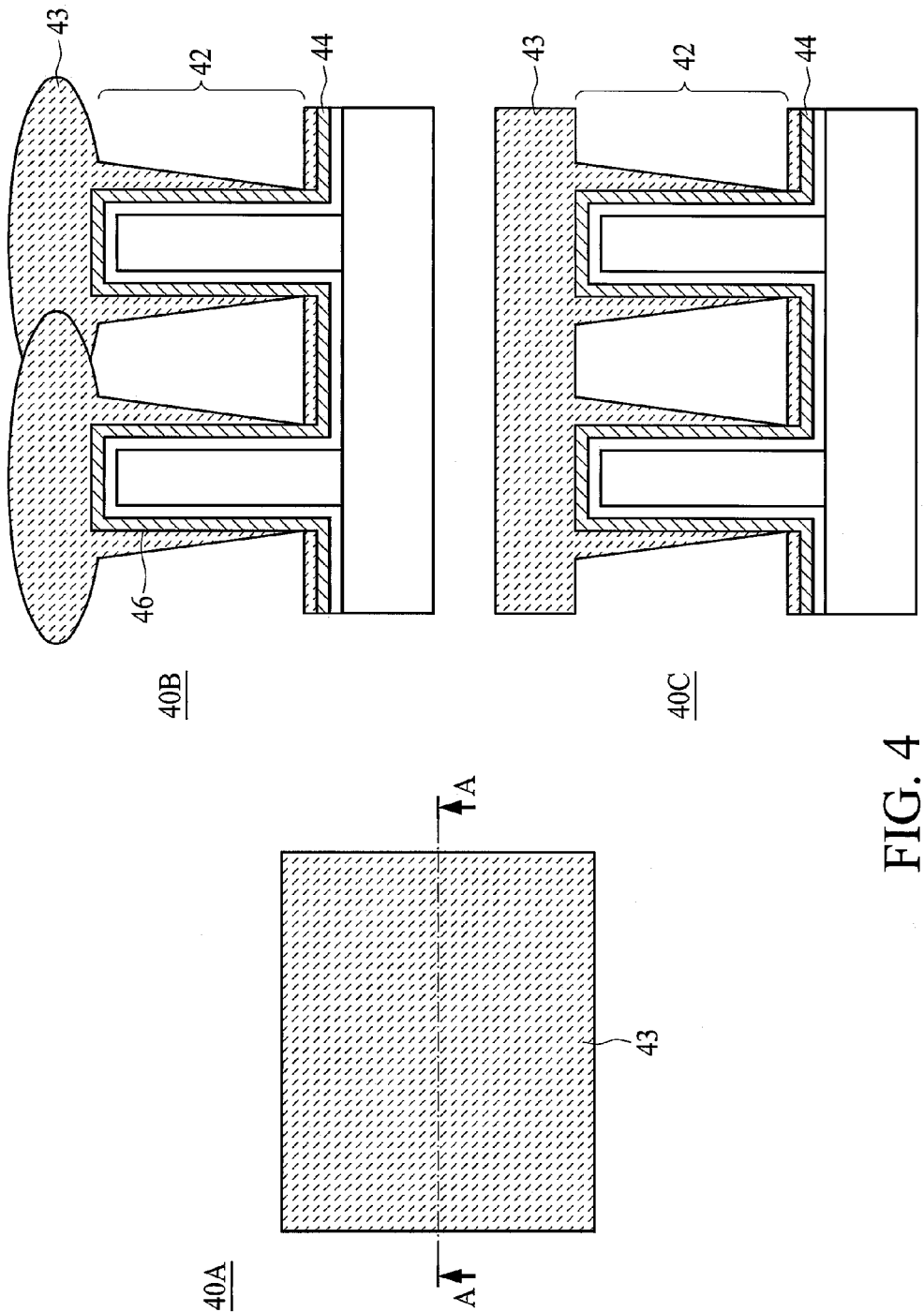

As shown in FIG. 4, 40A is the top view of the memory structure in fabrication, 40B is the cross sectional counterpart along the broken line AA of 40A, and 40C shows the structure of 40B after a chemical mechanical polishing (CMP) process. In the present step, a first non-conformal deposition is carried out. A layer of conductive film is formed through a blanket deposition of a poor conformity film. For example, tungsten silicide can be deposited using CVD, whereas aluminum, TiN/TaN can be formed using PVD. Although PVD is known for its production of poor conformity film, in the present invention, the layer of the conductive line materials does not have to be formed using PVD only. CVD depositing conductive materials such as tungsten silicide can also achieve the desired non-conformal film. An alternating process of PVD and CVD can be implemented as well. As shown in 40B, the non-conformal deposition starts by forming conductive film 43 on top of the stacked strips 42. Due to the poor conformity of the conductive film, the film bulges on the top of the strips 42 and grows laterally to merge with the film accumulated on the top of the adjacent strip 42. The merging of the film 43 takes shape as a continuous conducive film and ensures a complete electrical channel above the stacked strips 42. There are, however, chances to have a limited amount of conductive line materials deposited on the sidewall 46 of the stacked strips 42. In one embodiment, the thickest portion of the conductive line materials deposited on the sidewall 46 of the stacked strip 42 is at most one-tenth of the thickness of the conductive film 43 on the stacked strip. Therefore, the first air gap is formed as a result of the non-conformal deposition of the conductive film 43. Said first air gap is between two adjacent stacked strips 42 and under the layer of conductive film 43. In 40C, the merged conductive film 43 is leveled to have a more homogeneous thickness and a flat surface by a CMP process.

Figure 5:
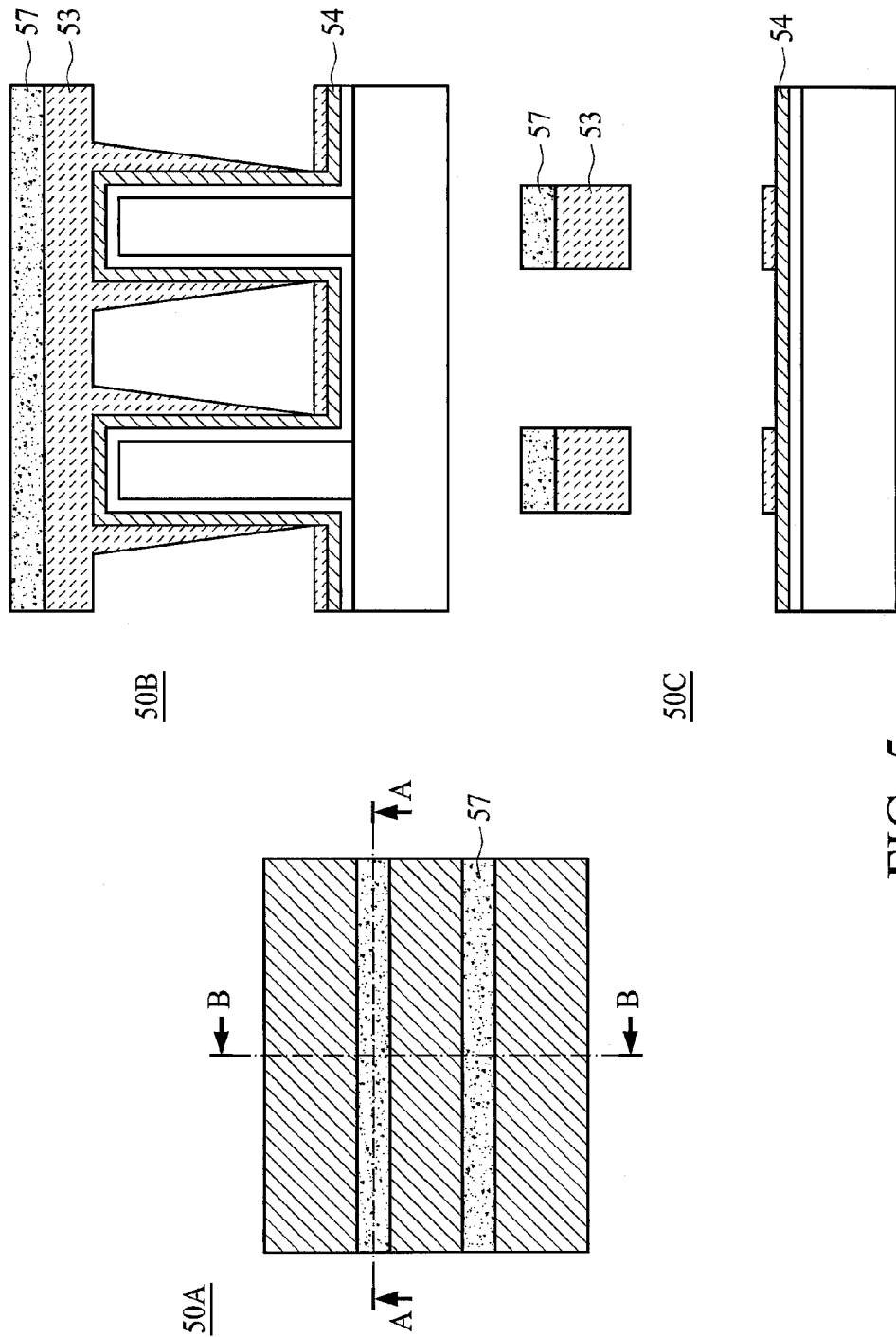

As shown in FIG. 5, 50A is the top view of the memory structure in fabrication, 50B is the cross sectional counterpart along the broken line AA of 50A, and 50C is the cross sectional counterpart along the broken line BB of 50A. The pattern of the photoresist 57 is formed on the conductive film 53 followed by a first anisotropic etch, preferably a reactive ion etch (RIE). The area of the conductive film 53 not protected by the photoresist is removed and the etching stops at the conductive liner 54. In other words, the selectivity between the conductive film 53 and the conductive liner 54 shall be high (for example, over 10) enough with respect to the first etchant used in the RIE process. In one embodiment, the material of the conductive film 53 is tungsten (W), and the material of the conductive liner is TiN. In another embodiment, the material of the conductive film 53 is Al, and the material of the conductive liner is TiN. 50A shows that the conductive liner 54 is exposed in the area without the protection of the photoresist. To maintain a high selectivity between the conductive line materials and the conductive liner materials is to ensure the overetch does not damage the stacked strips. Due to the high aspect ratio (over 10) of the stacked strip (or word-line) in a typical 3D memory structure, adopting overetch is unavoidable in order to remove the residual in the trench.

Figure 6:
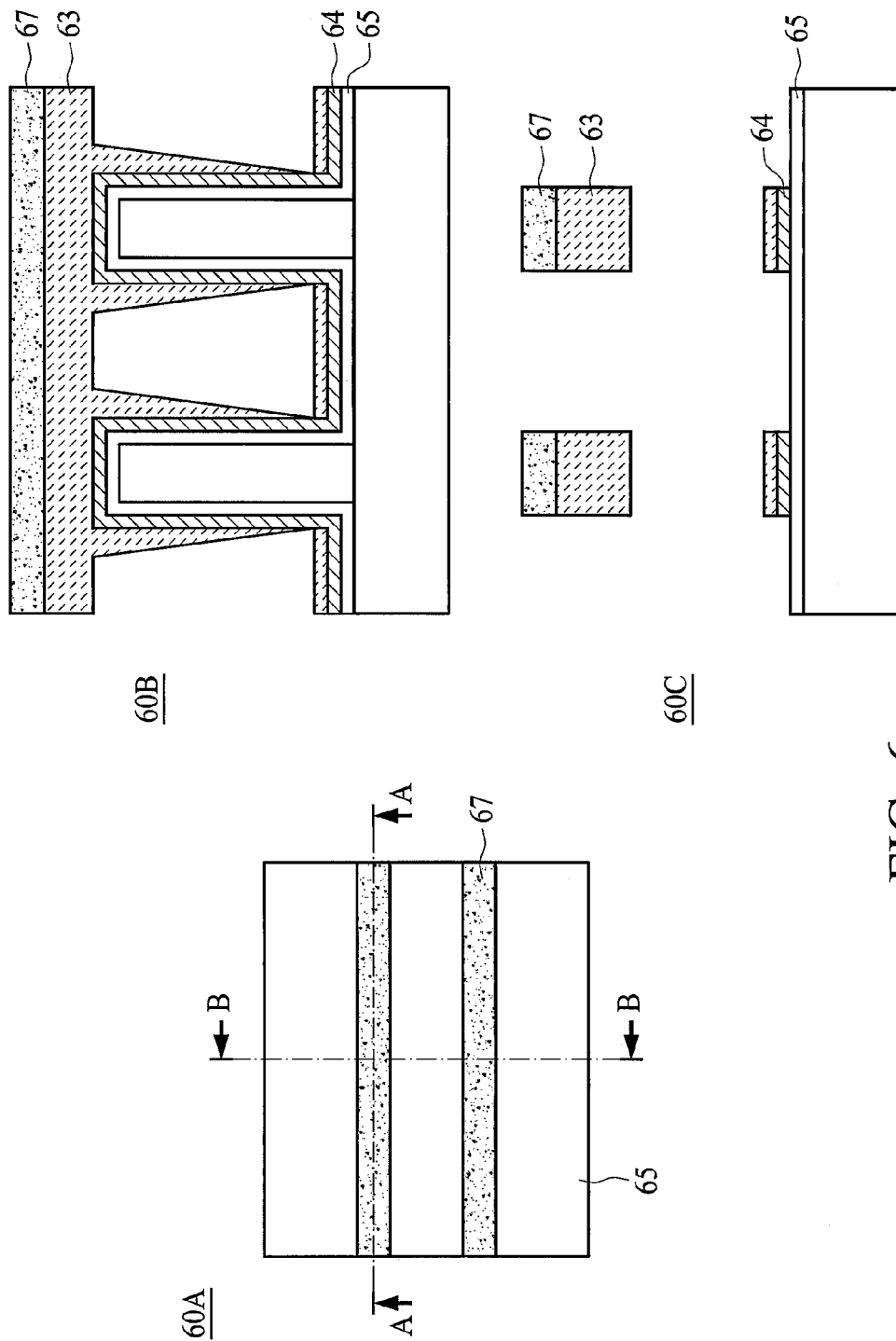

As shown in FIG. 6, 60A is the top view of the memory structure in fabrication, 60B is the cross sectional counterpart along the broken line AA of 60A, and 60C is the cross sectional counterpart along the broken line BB of 60A. In this step, a second anisotropic etch is carried out to remove the conductive liner 64 not shadowed by the photoresist pattern 67. Because the selection of the materials used as the conductive liner 64 and as the conductive film 63 is based on their respective selectivity over the same anisotropic etch, the second etchant used in the RIE process in order to remove the conductive liner 64 shall have different chemicals to the first etchant used in the first anisotropic etch. To maintain a high selectivity between the conductive line materials and the conductive liner materials is to ensure that the second anisotropic etch does not damage the conductive lines. 60A shows that the memory layer 65 is exposed in the area without the protection of the photoresist. If the selectivity is not high enough, the sidewall of conductive line may be potentially attacked by the second etchant and a narrower conductive line will form. Sheet resistance of the narrower conductive line would be increased. Therefore keeping the selectivity high is preferred in the present processing step.

Figure 7:
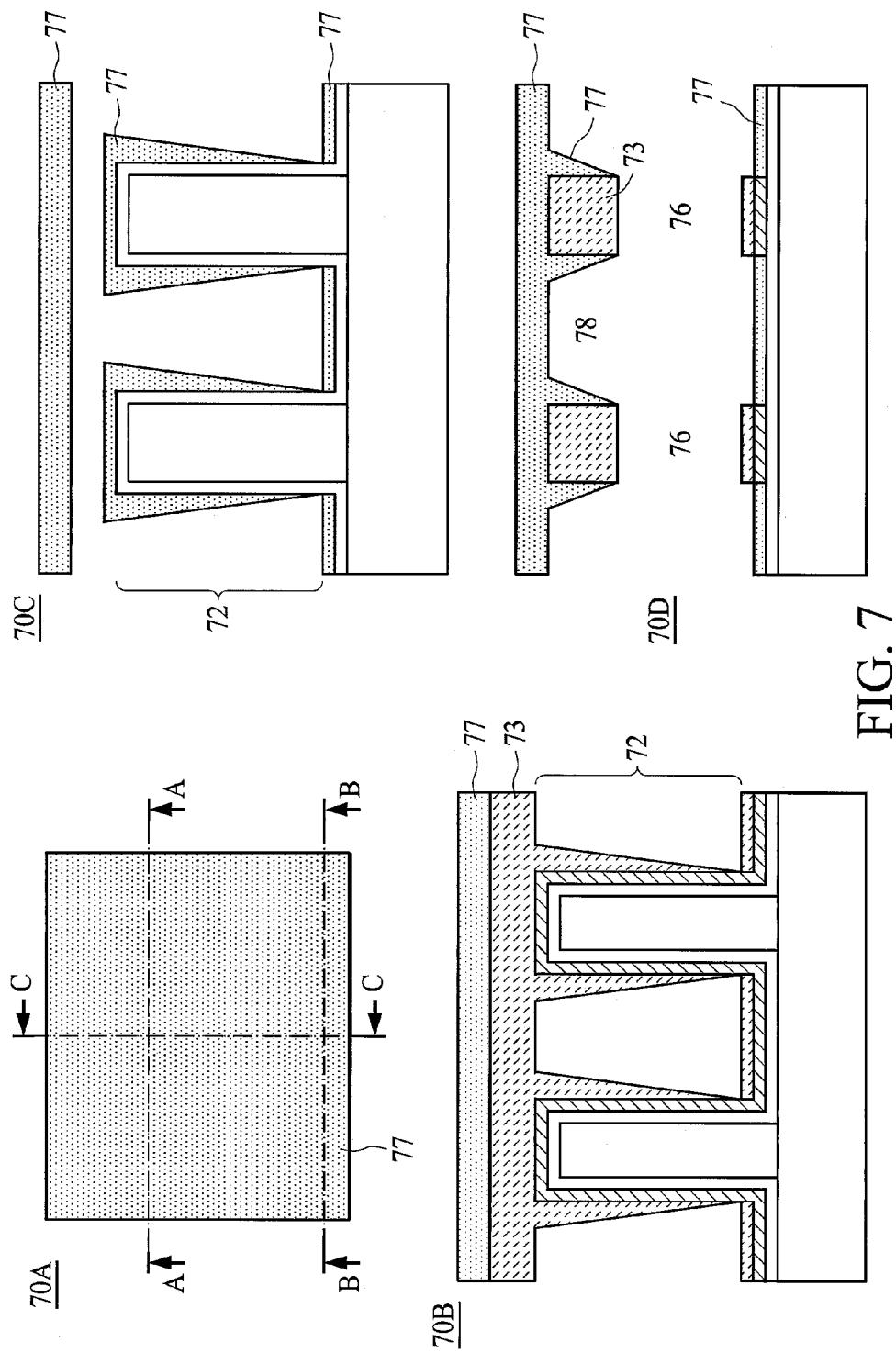

As shown in FIG. 7, 70A is the top view of the memory structure in fabrication, 70B is the cross sectional counterpart along the broken line AA of 70A, 70C is the cross sectional counterpart along the broken line BB of 70A, and 70D is the cross sectional counterpart along the broken line CC of 70A. Note that line AA cuts along the conductive lines, line BB is parallel to line AA, cutting through the region without conductive line, and line CC is orthogonal to lines AA and BB, cutting through the region without stacked strips. A second non-conformal deposition is carried out to deposit an insulating layer 77, such as ILD, after the photoresist is removed from the defined conductive lines. The second non-conformal deposition can utilize oxide deposition available in the art. As shown in 70C, there are, however, chances to have a limited amount of insulating materials deposited on the sidewall of a portion of the stacked strip 72, which is not shadowed by the conductive line.

In 70D, the first air gap 76 is formed between the two adjacent stacked strips 72 and under the shadowing region of the conductive line 73 at the completion of the formation of the conductive lines 73, whereas the second air gap 78 is defined to be the region between two adjacent conductive lines 73 at the completion of the present non-conformal oxide deposition step.

Figure 8:
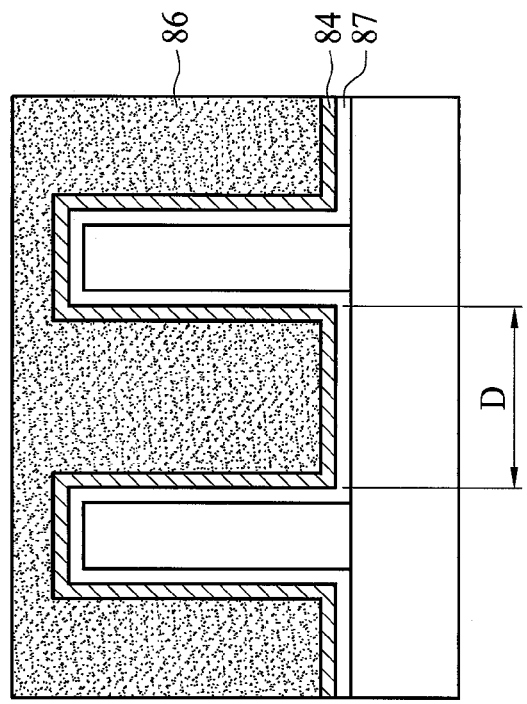
FIGS. 8 to 15 are top views and corresponding cross sectional views of the step of another manufacturing method of a 3-dimensional (3D) semiconductor memory structure according to one embodiment of the present invention.
Figure 8:
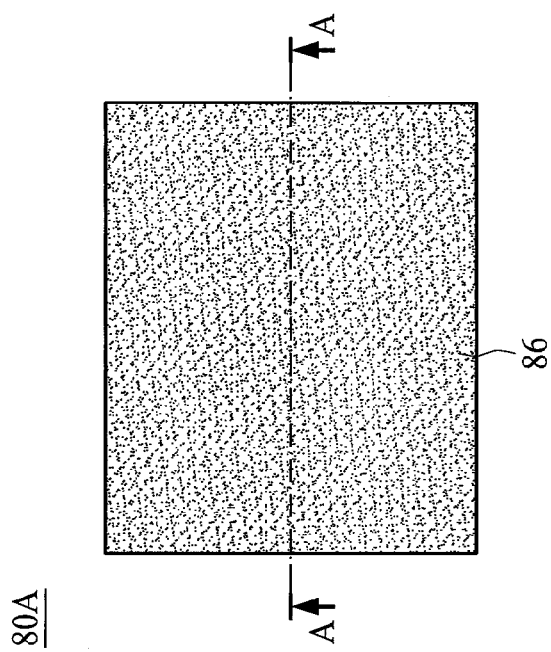

FIGS. 8 to 15 are top views and corresponding cross sectional views of the step of another manufacturing method of a 3-dimensional (3D) semiconductor memory structure according to one embodiment of the present invention. The steps of forming a plurality of parallel stacked strips and a layer of a conformal conductive liner on said strips can be identical or similar to that described in the previous manufacturing method (please refer to FIGS. 2 and 3), and the subsequent step is illustrated in FIG. 8. As shown in FIG. 8, 80A is the top view of the memory structure in fabrication, and 80B is the cross sectional counterpart along the broken line AA of 80A. The distance D between two adjacent stacked strips can be lower than 200 nm according to the present manufacturing method. A planarization process using ashable materials 86 is carried out to level the stacked strips covered with the memory layer 87 and the conductive liner 84. Spin coating with an appropriate spinning rate can be used depending on the ashable material that are applied in order to properly fill the trenches between the stacked strips. Ashable materials comprises organic dielectric materials (ODL), TOPAZ, SHB, and BARC or the like, can be ashed away by oxygen plasma. In one embodiment, TOPAZ is used as the ashable material due to the fact that TOPAZ is able to sustain over the deposition temperature of the subsequent conductive lines deposition. The temperature to which the TOPAZ does not show obvious degradation can be 500 degrees Celsius in one of the embodiments.

Figure 9:
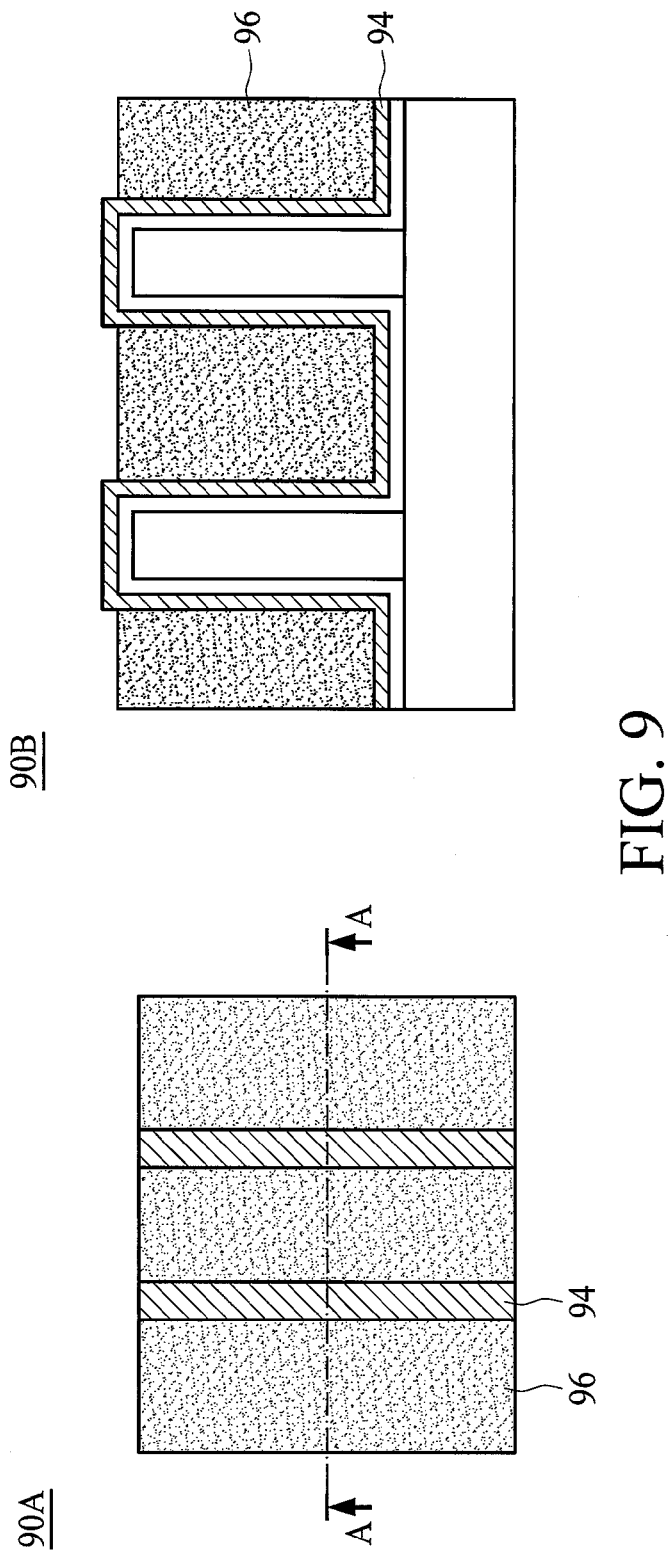
Figure 10:
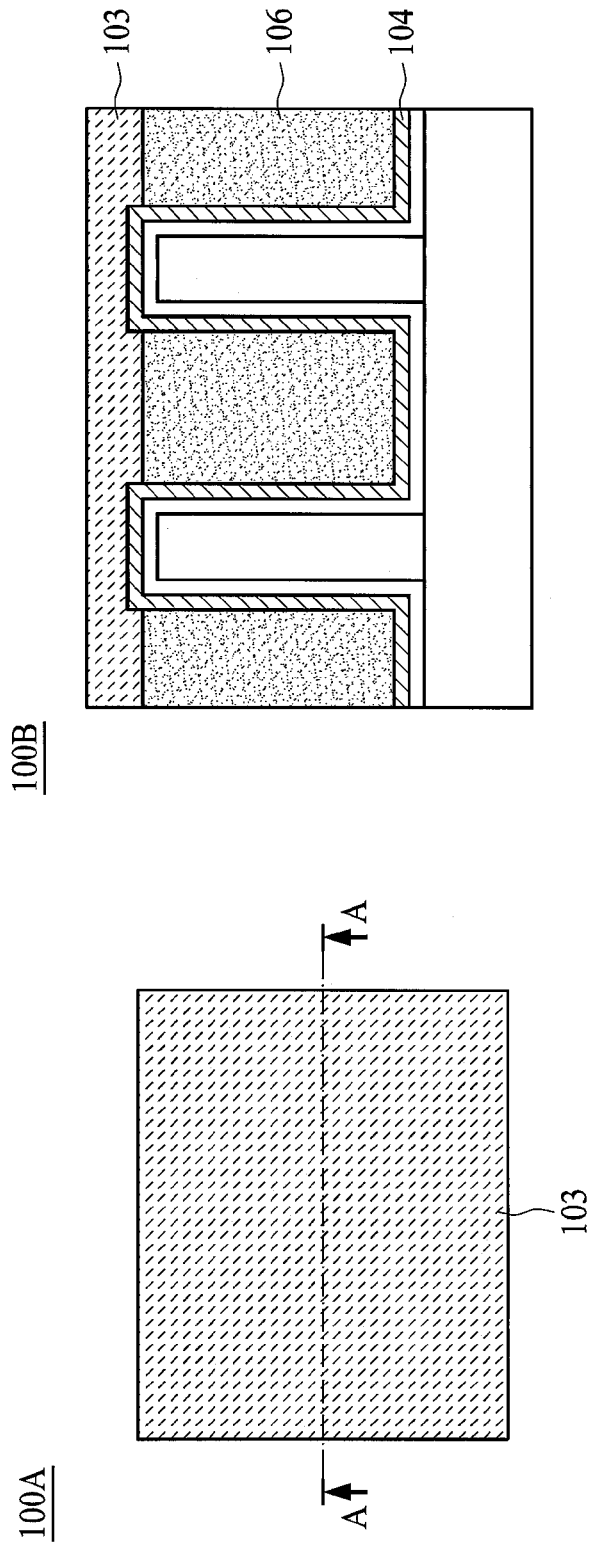

90A of FIG. 9 is the top view of the memory structure in fabrication, and 90B is the cross sectional counterpart along the broken line AA of 90A. The TOPAZ 96 in the present structure is etched back to expose a portion of the conductive liner 94, particularly the portion on top of the stacked strip. A blanket etch (for example, an isotropic oxygen plasma etch) can be utilized to carry out this etch back step. 100A of FIG. 10 is the top view of the memory structure in fabrication, and 100B is the cross sectional counterpart along the broken line AA of 100A. Conductive film 103 is deposited on top of the TOPAZ 106 and the exposed conductive liner 104, wherein the conductive film 103 can be p+ or n+ poly-silicon, aluminum, tungsten, or the combination thereof. The deposition temperature of the aforesaid materials selection is below 400 degrees Celsius in one embodiment, and preventing the degradation of the TOPAZ during the conductive film 103 deposition. On the other hand, said deposition process is free of any oxygen or oxygen derivatives because the reactive class of its kind can damage the structural integrity of the TOPAZ. The thickness of the conductive film 103 can be greater than that of the exposed conductive liner 104.

Figure 11:
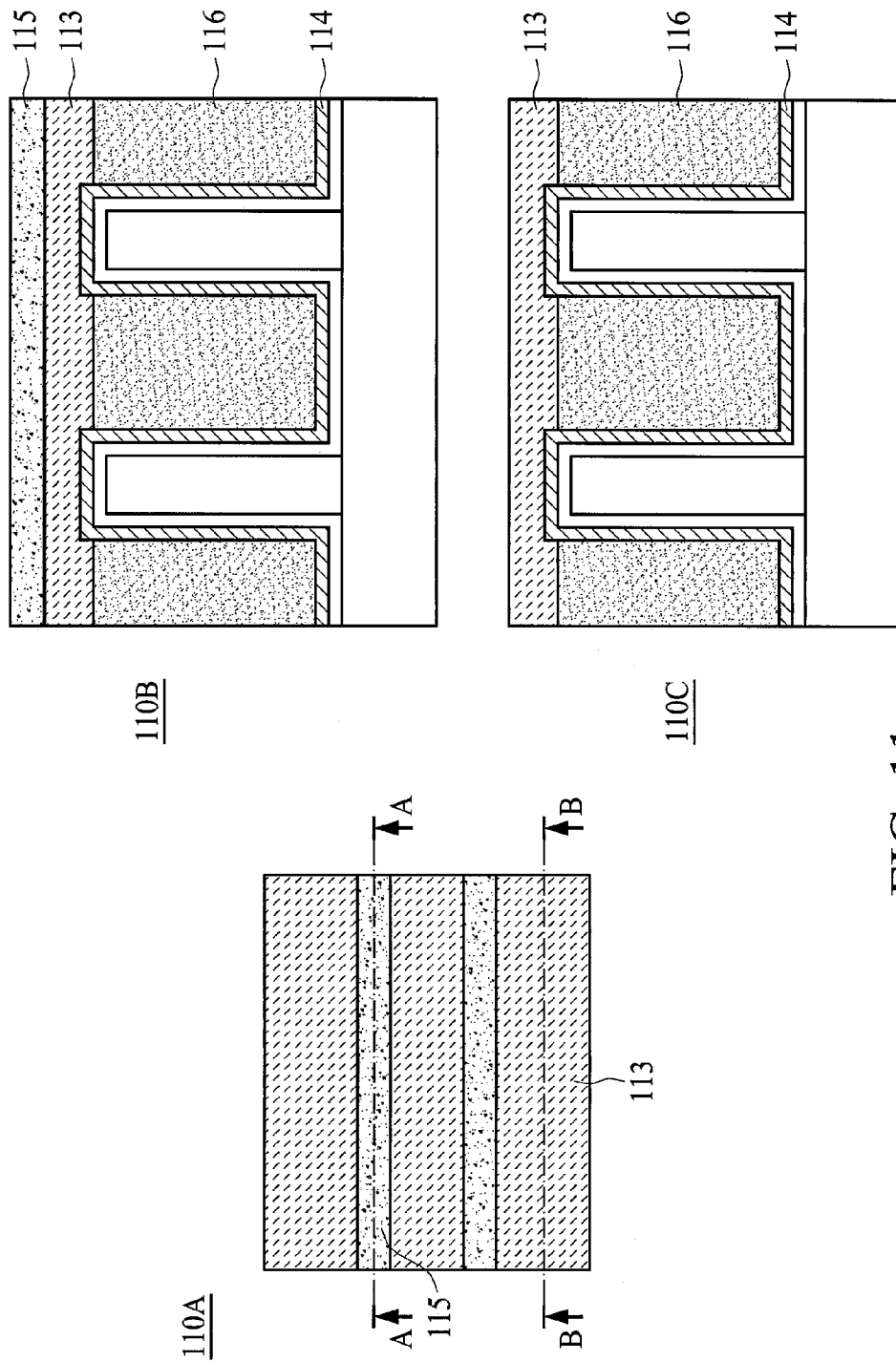
Figure 12:
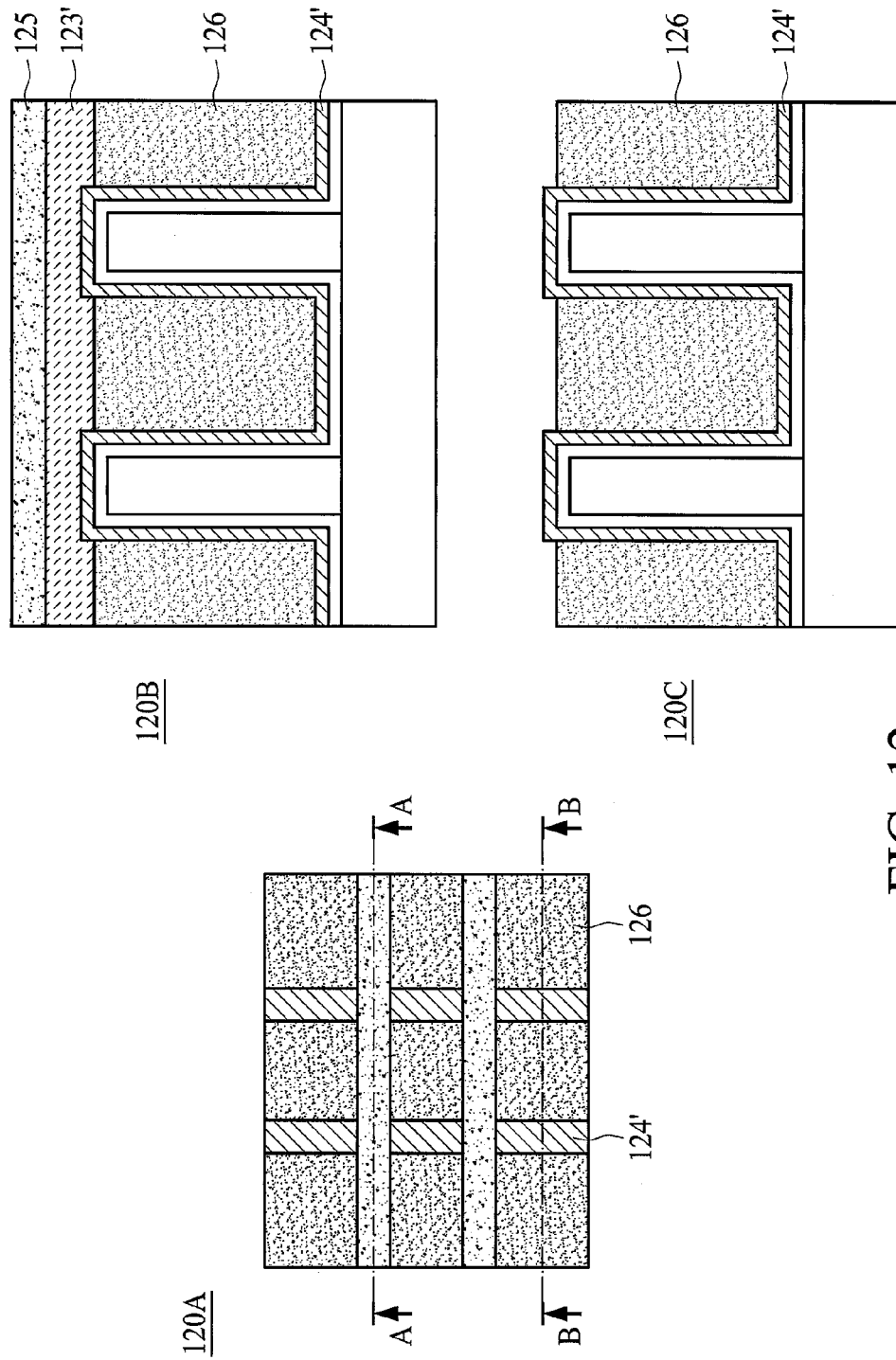

As shown in FIG. 11, 110A is the top view of the memory structure in fabrication, 110B is the cross sectional counterpart along the broken line AA of 110A, and 110C is the cross sectional counterpart along the broken line BB of 110A. A pattern of the photoresist 115 is formed on top of the conductive film 113 and the conductive lines 123 are defined after the anisotropic etch as illustrated in FIG. 12. As shown in FIG. 12, 120A is the top view of the memory structure in fabrication, 120B is the cross sectional counterpart along the broken line AA of 120A, and 120C is the cross sectional counterpart along the broken line BB of 120A. The anisotropic etch (for example, an RIE) utilizes a third etchant to remove the portion of conductive film 113 without the protection of the photoresist 125, and the underlying conductive liner 124' in said portion is exposed after the RIE as shown in 120C. The conductive lines 123' are formed orthogonally on the stacked strip, contacting the exposed conductive liner 124'.

Figure 13:
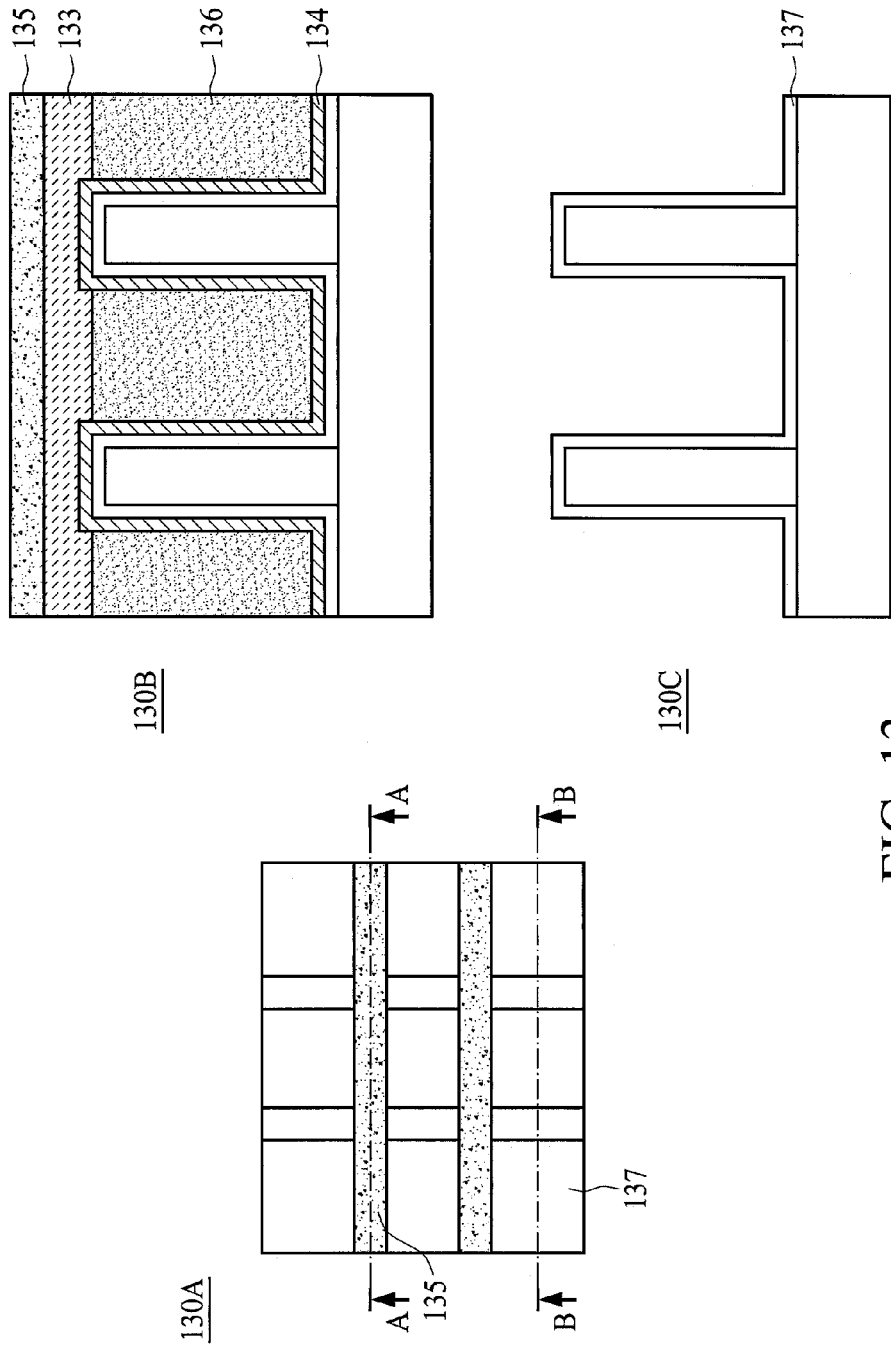

The exposed conductive liner 124' and the exposed TOPAZ 126 shown in FIG. 12 are further removed by a subsequent anisotropic etch as illustrated in FIG. 13. As shown in FIG. 13, 130A is the top view of the memory structure in fabrication, 130B is the cross sectional counterpart along the broken line AA of 130A, and 130C is the cross sectional counterpart along the broken line BB of 130A. The anisotropic etch (such as an RIE) utilizes a fourth etchant to remove the exposed TOPAZ 136 as well as the exposed conductive liner 134, and stops at the memory layer 137. Due to the deep trench topography between the two adjacent stacked strips, the fourth etchant shall possess high selectivity (for example, 5:1) between the conductive line 133 and the TOPAZ 136/conductive liner 134 because an extended overetch may be implemented. The potential lateral degradation of the conductive lines 133 during the overetch period can be minimized if said selectivity of the fourth etchant is over 10:1. In one embodiment, the third etchant and the fourth etchant used in the present manufacturing method are different.

Figure 14:
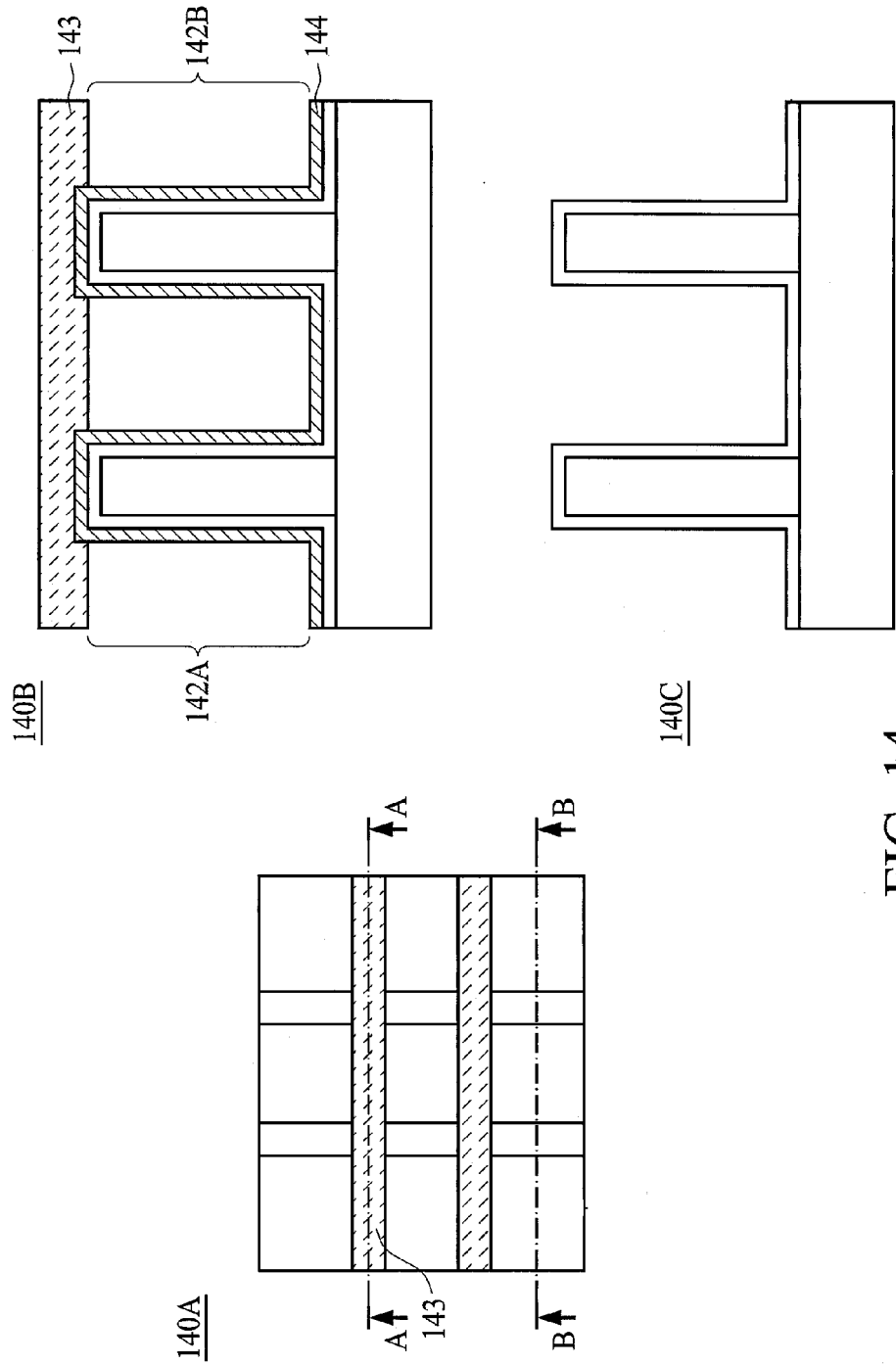

In FIG. 14, 140A is the top view of the memory structure in fabrication, 140B is the cross sectional counterpart along the broken line AA of 140A, and 140C is the cross sectional counterpart along the broken line BB of 130A. As shown in FIG. 13, photoresist 135 and TOPAZ 136 are removed by a stripping/ashing process. An isotropic oxygen plasma etch can be used to ash away the TOPAZ under the conductive lines 143. The first air gap, which is located between two adjacent stacked strips (142A, 142B) and under the shadowing region of the conductive line 143, is then formed. The conductive liners 144 shadowed under the conductive lines 143 are retained in the memory structure 140B after the stripping/ashing process. A waste clean process can optionally follow to ensure the ashable material is completely removed.

Figure 15:
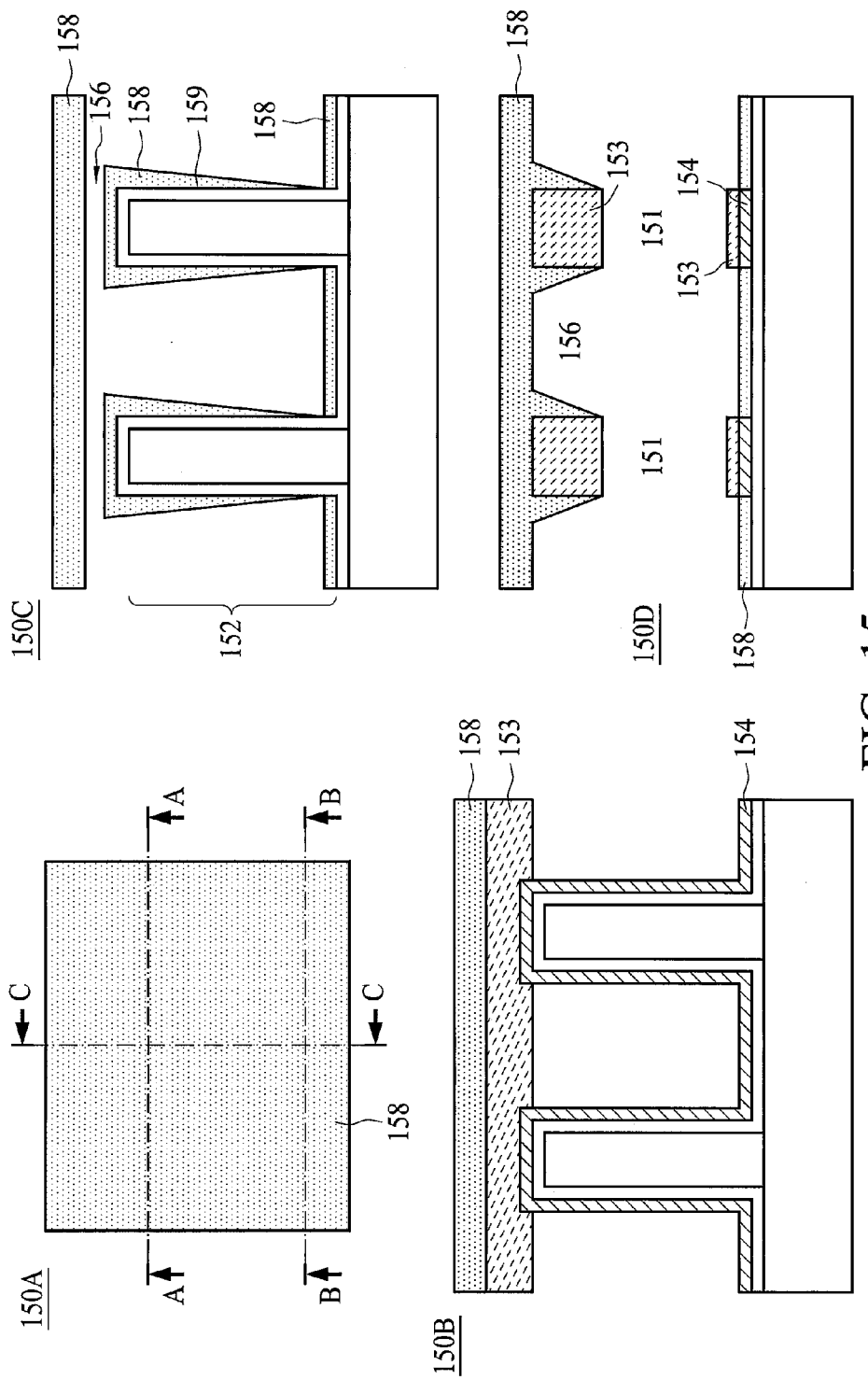

In FIG. 15, 150A is the top view of the memory structure in fabrication, 150B is the cross sectional counterpart along the broken line AA of 150A, 150C is the cross sectional counterpart along the broken line BB of 150A, and 150D is the cross sectional counterpart along the broken line CC of 150A. Note that line AA cuts along the conductive lines, line BB is parallel to line AA, cutting through the region without conductive line, and line CC is orthogonal to lines AA and BB, cutting through the region without stacked strips. An insulating layer 158 (for example, an interlayer dielectric) is subsequently deposited on the conductive lines 153 in a non-conformal manner. 150C shows a second air gap 156 between two adjacent conductive lines 153 after the completion of the non-conformal oxide deposition process. The deposition process can be PVD, CVD, or the combination thereof. As shown in 150C, there are, however, chances to have a limited amount of insulating materials deposited on the sidewall 159 of a portion of the stacked strip 152 which is not shadowed by the conductive lines 153.

In 150D, the first air gap 151 is formed between the two adjacent stacked strips 152 and under the shadowing region of the conductive line 153 at the completion of the formation of the conductive lines 153, whereas the second air gap 156 is defined to be the region between two adjacent conductive lines 153 at the completion of the present non-conformal oxide deposition step.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
   forming a plurality of stacked strips, arranged parallel to each other on a substrate;
   forming a conductive liner compliant to the stacked strips by conducting a conformal deposition;
   planarizing the stacked strips with an ashable material layer;
   exposing a portion of the conductive liner by etching back the ashable material layer; and
   forming a plurality of conductive lines, arranged parallel to each other, orthogonally positioned on the stacked strip, and contacting the exposed conductive liner.

2. The method according to claim 1, further comprising a step of forming an insulating layer on the conductive line by a non-conformal deposition.

3. The method according to claim 1, further comprising a step of forming a memory layer between the stacked strips and the conductive liner.

4. The method according to claim 1, wherein the distance between two adjacent stacked strips is below 300 nm.

5. The method according to claim 1, further comprising the following steps:
- forming conductive film on the ashable material layer and the conductive liner;
- etching the conductive film to define the conductive line by a third etchant; and
- etching the portion of the conductive liner and the ashable material layer not shadowed by the conductive line by a fourth etchant;
- wherein the third and the fourth etchant are different.

* * * * *